(12) United States Patent
Chen et al.

(10) Patent No.: US 6,838,217 B1
(45) Date of Patent: Jan. 4, 2005

(54) DEFINE OVERLAY DUMMY PATTERN IN MARK SHIELDING REGION TO REDUCE WAFER SCALE ERROR CAUSED BY METAL DEPOSITION

(75) Inventors: Yi-Lin Chen, Taipei (TW); Szu-Ping Chen, Taipei (TW); Chin-Chuan Hsieh, Hsin-chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 219 days.

(21) Appl. No.: 10/163,709

(22) Filed: Jun. 6, 2002

(51) Int. Cl.[7] .............................. G03F 9/00; G03C 5/00
(52) U.S. Cl. ............................................. 430/22; 430/5
(58) Field of Search ............................... 430/5, 22, 30, 430/311, 312, 313, 322

(56) References Cited

U.S. PATENT DOCUMENTS

| | | | |
|---|---|---|---|
| 5,705,320 A | * | 1/1998 | Hsu et al. |
| 5,870,201 A | | 2/1999 | Bae .............................. 356/401 |
| 5,946,583 A | * | 8/1999 | Wu |
| 5,952,132 A | | 9/1999 | King et al. .................... 430/22 |
| 6,165,656 A | | 12/2000 | Tomimatu ..................... 430/22 |
| 6,261,918 B1 | * | 7/2001 | So |

* cited by examiner

Primary Examiner—Saleha R. Mohamedulla (57) ABSTRACT

A new method is provided for the creation of a dummy pattern. A typical wafer exposure mask contains a Clear Out Window (CLWD) pattern, this CLWD pattern is of no value during the process of shielding the area on the surface of the wafer where the alignment mark must be placed. This CLWD can therefore be used to create a dummy overlay pattern, resulting in a reduction in the wafer scaling error that typically occurs as a result of metal deposition. For the same reasons, a dummy overlay pattern can also be created in the scribe lines of the wafer surface.

32 Claims, 5 Drawing Sheets

DEFINE OVERLAY DUMMY PATTERN IN MARK SHIELDING REGION TO REDUCE WAFER SCALE ERROR CAUSED BY METAL DEPOSITION

BACKGROUND OF THE INVENTION (1) Field of the Invention

The invention relates to the fabrication of integrated circuit devices, and more particularly, to a method of eliminating errors in measuring overlay that are caused by metal deposition asymmetry before metal etching.

(2) Description of the Prior Art

Continued emphasis on semiconductor device reduction has placed increased emphasis on the alignment of the overlying patterns that are required for the creation of a semiconductor device. Such patterns are typically created using a photolithographic process in which a pattern of the circuit is transferred from a microscopic scale onto the surface of a substrate where the pattern becomes part of a semiconductor device.

In order to enhance device throughput, a typical photolithographic process uses a step-and-repeat function for the transfer of the pattern that is contained in the mask to the surface that is being exposed. A number of errors and inaccuracies-can be introduced during this exposure process, it is for instance of key importance that overlying layers of material that are to be processed are exactly aligned with each other since misalignment leads to serious concerns of device performance and reliability. It is therefore of critical importance that overlay of the successive exposures is performed with an extreme degree of accuracy.

One of the methods that is used for measuring alignment of successive and overlying patterns is the box-in-box approach in which alignment aids are located at different areas such as the peripheral area of the surface of the substrate. The accuracy of alignment is then determined by comparing deviations in the centerlines of the box with a process average. For the performance of accurate alignment a number of these box-in-box patterns must be created in a number of locations on the die.

One of the problems that is encountered using the box-in-box technique is that asymmetric deposition of metal before an etch of one of the patterns of the box-in-box alignment marks introduces a measurement error. It has been observed that the measurement error for substrate scale alignment is about 0.3 to 1.0 ppm, which causes a 30 to 100 nm measurement difference between before and after metal etching. The invention addresses these concerns and provides a method that reduces the impact of asymmetric metal deposition on the accuracy of measuring alignment of overlying patterns of exposure.

U.S. Pat. No. 6,165,656 (Tomimatu) shows a box in box pattern error measurement method involving dummy patterns.

U.S. Pat. No. 5,952,132 (King et al.) shows a box in box pattern and error measurement method.

U.S. Pat. No. 5,870,201 (Bae) shows a box-In-box pattern and method.

SUMMARY OF THE INVENTION

A principle objective of the invention is to provide a method of measuring alignment between successive overlying patterns of exposure that does not experience a negative impact introduced by metal deposition asymmetry.

In accordance with the objectives of the invention a new method is provided for the creation of a dummy pattern. A typical wafer exposure mask contains a Clear Out Window (CLWD) pattern, this CLWD pattern is of no value during the process of shielding the area on the surface of the wafer where the alignment mark must be placed. This CLWD can therefore be used to create a dummy overlay pattern, resulting in a reduction in the wafer scaling error that typically occurs as a result of metal deposition. For the same reasons, a dummy overlay pattern can also be created -n the scribe lines of the wafer surface.

DESCRIPTION OF THE PREFERRED EMBODIMENTS

The reasons for wafer scale errors are first highlighted, using FIGS. 1a through 6b for this purpose.

Figure 1A:
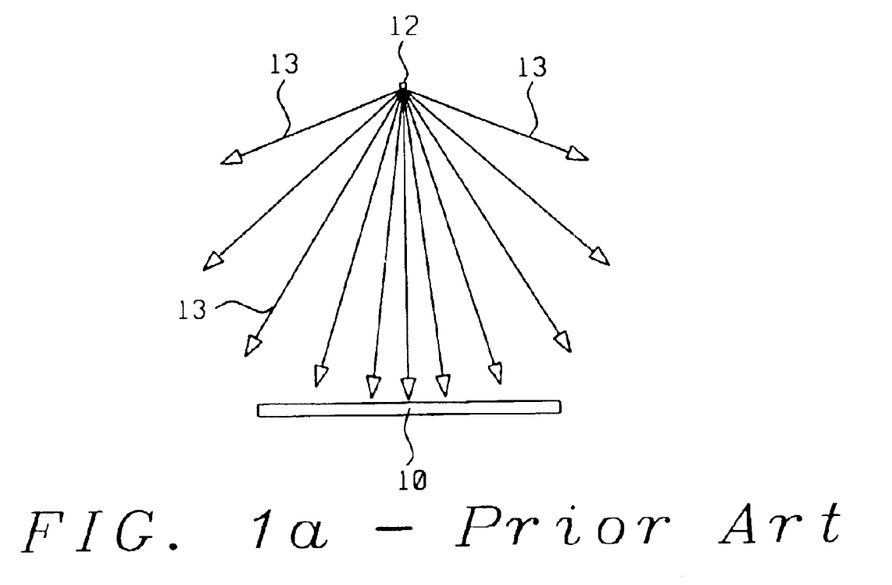
FIGS. 1a and 1b show patterns of deposition such as metal sputtering.
Figure 1B:
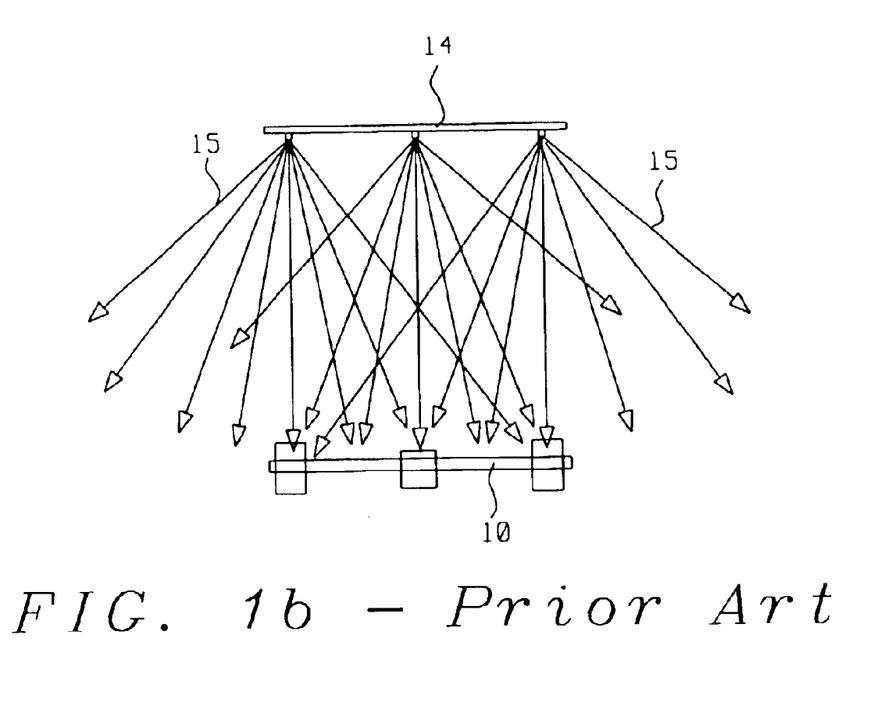

Referring now specifically to FIGS. 1a and 1b, there are shown two examples of exposure patterns whereby the exposure patterns originate from a source of different width or concentration. The example that is shown in FIG. 1a represents a source 12 of energy that is concentrated and can be considered a point of energy. The patterns of transmissions 13 and 15 that are shown in FIGS. 1a and 1b respectively can equally represent molecules of a semiconductor material such as metal that is sputter deposited on a semiconductor surface 10, such as the surface of a semiconductor substrate. Source 14 that is shown in FIG. 1b will be recognized as a distributed source of emission of radiated pattern 15.

Several observations can be made relating to the emission patterns that are shown in FIGS. 1a and 1b, as follows:

the lines of propagation or flux lines 13 have a wide (distribution of) angle of emission from the source 12, which indicates that the totality of flux lines 13 is not densely concentrated or narrowly focused the angle under which flux lines 13 strike the surface of semiconductor layer 10 does not have a wide (distribution of) variation in value the lines of propagation or flux lines 15 equally have a wide angle of emission from the source 14, which indicates that the totality of flux lines 15 is not densely concentrated or narrowly focused, and the angle under which flux lines 15 strike the surface of semiconductor layer 10 has a relatively wide variation in value.

Figure 2A:
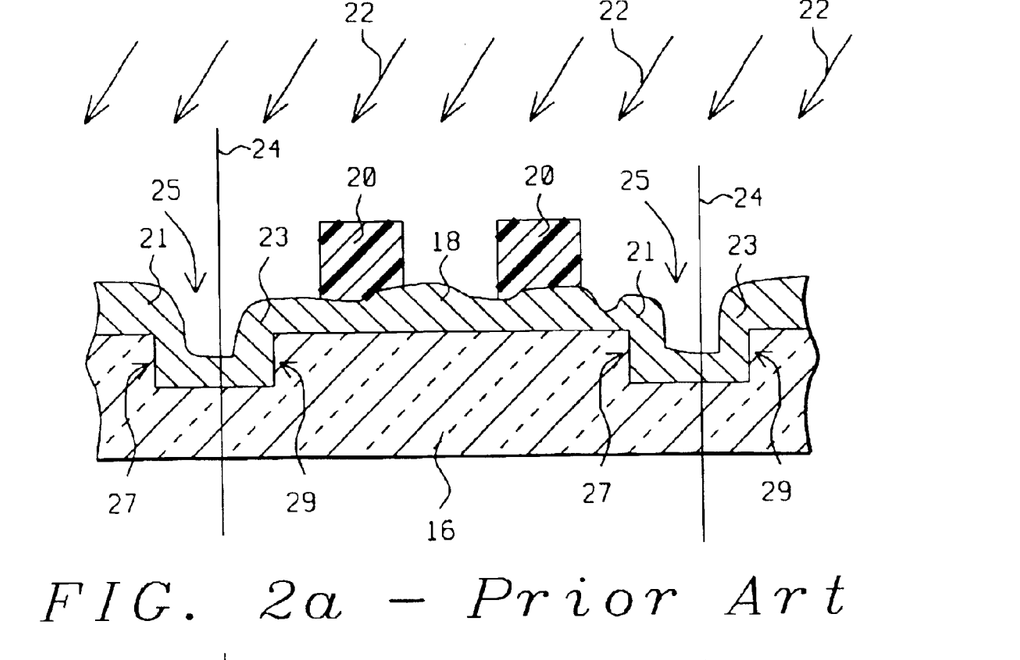
FIGS. 2a and 2b show cross sections of a semiconductor surface, providing detail relating to the asymmetry that is introduced during metal sputtering.
Figure 2B:
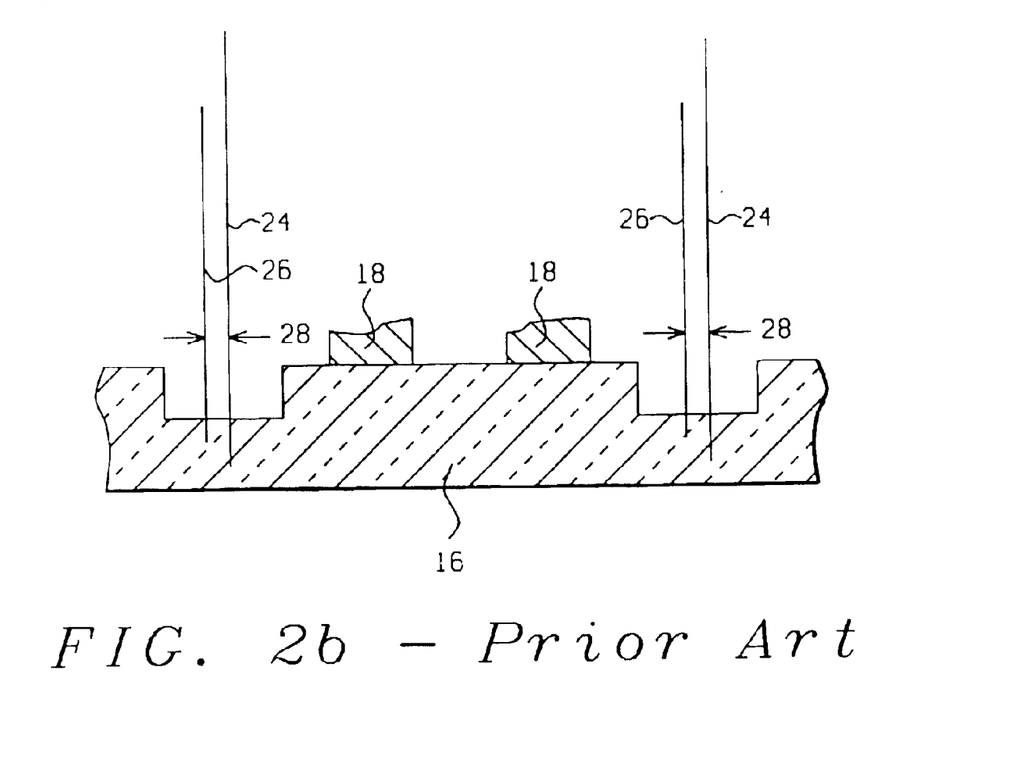

These observations as they have been highlighted using FIGS. 1a and 1b can be transposed to a semiconductor device creation environment using FIGS. 2a and 2b. Highlighted in FIGS. 2a and 2b are the following elements:

16, a layer of oxide over the surface of which a pattern of metal is to be created 18, a layer of metal deposited over the surface of layer 16 of oxide 20, a mask of photoresist that has been created over the surface of layer 18 of metal 22, the direction of the metal deposition, applied for the creation of layer 18 of metal 24, a reference line that is used to measure the accuracy or deviation from a norm of the metal deposition of layer 18, specifically where this metal deposition is affected in openings 25 that have been created in layer 16 of oxide; this measurement reference line is used After Development Inspection (ADI), that is after the cross section that is shown in FIG. 2a has been completed, more specifically after the photoresist pattern 20 has been developed 25, openings created in layer 16 of oxide; these openings 25 have been created for reasons of highlighting the effect that the angular direction 22 of the metal deposition has on the metal 18 that is deposited over layer 16 of oxide 26, a reference line that is used to measure the accuracy or deviation from a norm of the metal deposition of layer 18, specifically where this metal deposition is affected in openings 25 that have been created in layer 16 of oxide; this measurement reference line is used After Etch Inspection (AEI), that is after the cross section that is shown in FIG. 2b has been completed. More specifically after opening 25 have been etched in the layer 16 of oxide 28, the overlay error that is introduced by the angular nature of metal (sputter) deposition 22.

This later overlay error can be explained by observing the areas of metal layer 18 that have been highlighted as areas 21 and 23 in FIG. 2a. It is clear from the cross section of FIG. 2a that sputter metal deposition 22 strikes side 27 of opening 25 directly while metal accumulates over side 29 only indirectly. From this can be concluded that a thicker layer of metal will accumulate in region 21, FIG. 2a, than will accumulate in region 23. Therefore, during metal etch, the metal in region 23 will be removed more readily and completely than the metal in region 27, resulting in an error of overlay that has been highlighted as difference or error 28.

In short, an overlay error is introduced due to the angle under which metal deposition 22 takes place. The shallower the angle of deposition 22, that is the more the deposition 22 deviates from impacting the surface on which the deposition takes place under an angle of 90 degrees, the more pronounced or larger the overlay error is. If the deposition 22 strikes the surface over which the metal is deposited under an angle of 90 degrees, it is to be expected that no difference exists between deposited regions 21 and 23 and that therefore no overlay error will be created.

The impact that the deposition error has on creating a semiconductor device will be realized after it is pointed out that an alignment error that is observed after the layer of photoresist has been developed (After Development Inspection or ADI) can be addressed by reworking the wafer by stripping the photoresist mask 20 and reworking the wafer. However, an alignment error that is in effect after openings 25 have been created in the layer 16 of dielectric (oxide), which is detected at After Etch Inspection (AEI), cannot be corrected and results in a rejected and scrapped wafer.

This phenomenon, of having deposits of metal being created on the surface of a substrate such that the deposited layer of metal shows an overlay error that is dependent on the location within the surface of the wafer where this layer of metal is created, is further highlighted using FIGS. 3 through 6b.

For these various figures, different and extreme locations are selected on the surface of the wafer in order to best demonstrate the above-indicated phenomenon.

Figure 3:
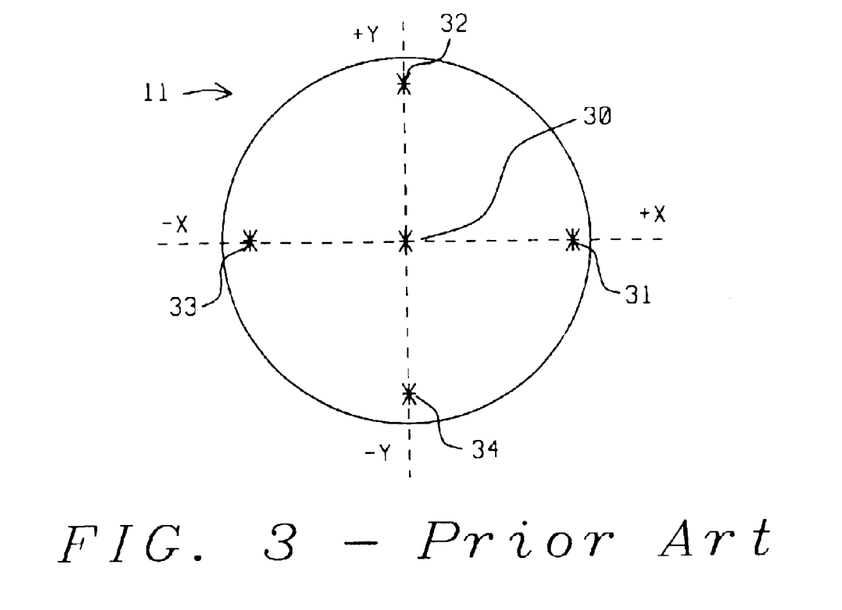
FIG. 3 shows a top view of a semiconductor substrate with specific points identified on the surface thereof.

FIG. 3 highlights the locations that have been selected on the surface of the wafer, as follows:

30 is the geometric center of the wafer 11

31 is selected on the +X axis 32 is selected on the +Y axis 33 is selected on the −X axis, and 34 is selected on the −Y axis.

FIGS. 4a through 6b show the overlay error that is incurred for metal depositions created in the above highlighted locations on the surface of wafer 11 whereby it is assumed for all the figures shown that the source of metal sputtering is a centralized source (such as shown in FIG. 1a) and is located above the center 30 of wafer 11.

Figure 4A:
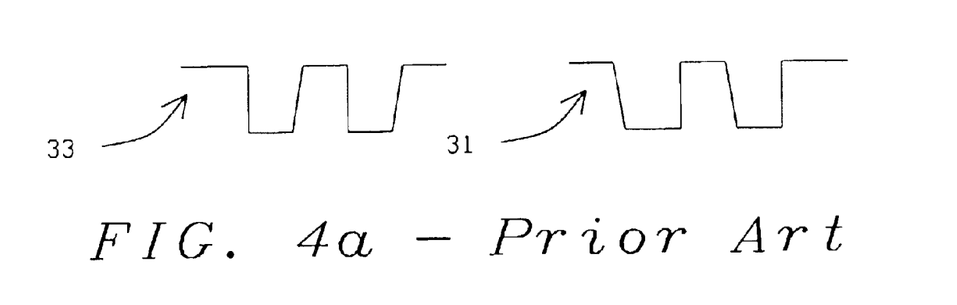
FIGS. 4a and 4b show deposition cross sections of first locations on the surface of a substrate.
Figure 4B:
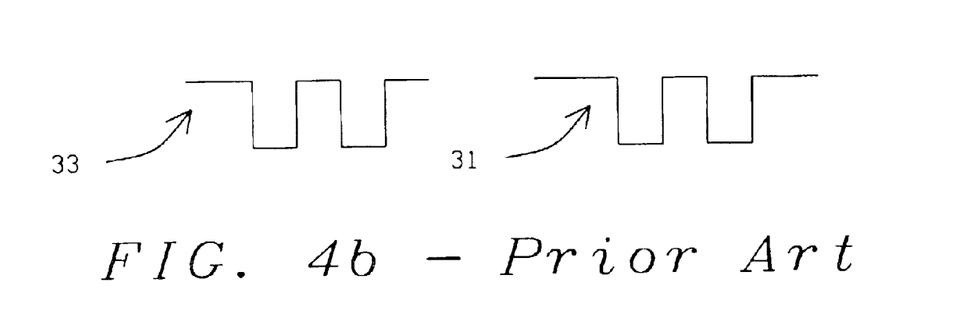

FIGS. 4a and 4b show overlay errors of the metal depositions after etching of the layer of dielectric (such as layer 16 of FIGS. 2a and 2b) for locations 33 and 31, specifically FIG. 4a snows a cross section in the +X to −X direction while FIG. 4b shows a cross sect-on in the +Y to −Y direction. Since the source of metal sputter is located above the center 30 of wafer 11, locations 33 and 31 suffer from the previously highlighted metal accumulation (areas 21, FIG. 2a) in an X-direction, which is shown in the cross section of FIG. 4a. Since the locations 33 and 31 have a zero Y-coordinate, in cross section in the +Y to −Y direction that is shown in FIG. 4b does not suffer any overlay errors due to metal accumulation (in the Y direction).

Figure 5A:
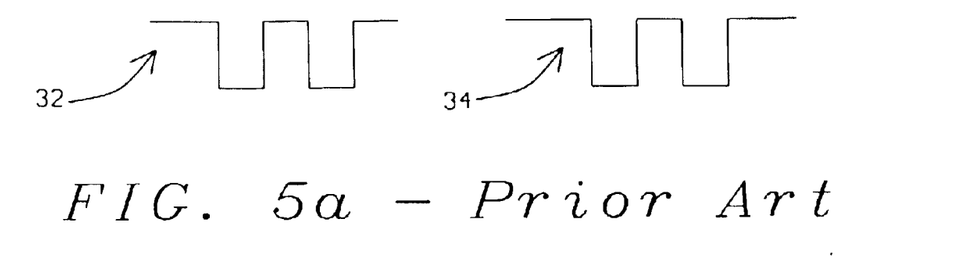
FIGS. 5a and 5b show deposition cross sections of second locations on the surface of a substrate.
Figure 5B:
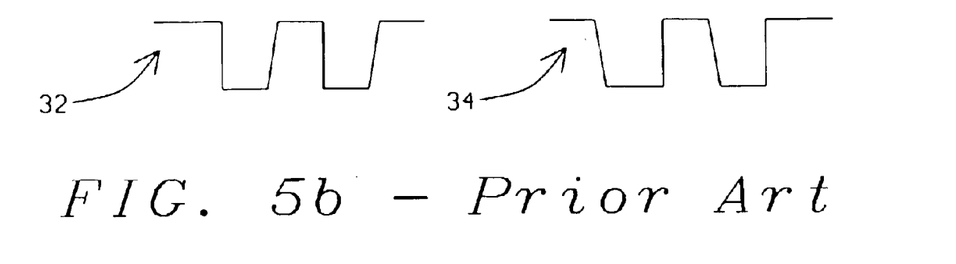
Figure 6A:
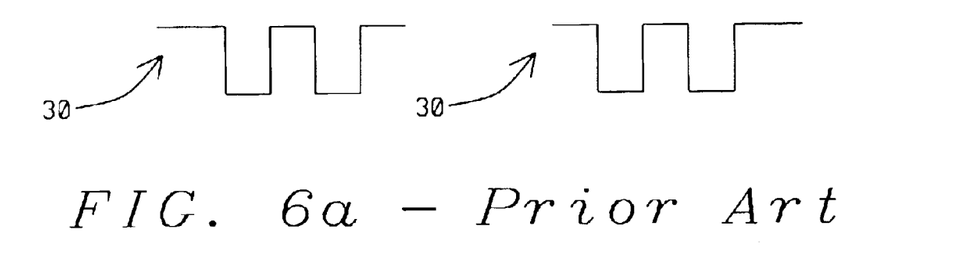
FIGS. 6a and 6b show deposition cross sections of third locations on the surface of a substrate.
Figure 6B:
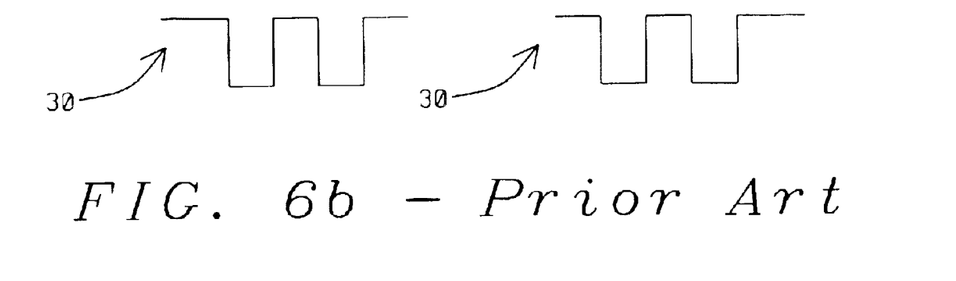

Similar reasoning leads to the cross sections that are shown in FIGS. 5a and 5b for locations 34 and 32, and the cross sections that are shown in FIGS. 6a and 6b for location 30. Since location 30 is located directly underneath the source of metal sputter, this location (and only this location) does not incur an overlay error during metal deposition. All sides of the opening in which the metal is deposited is overlaid with an equal amount of metal, the deposited metal will therefore be etched from all sides of the opening in equal measure.

The above highlighted FIGS. 1a through 6b highlight typically experienced effects of what can be referred to as Metal Deposition Asymmetry Effect (MDAE). Since metal is typically used as one of the reflective layers for the creation of alignment marks and the like, it is of benefit to avoid problems created by the MDAE phenomenon. This can be accomplished by using a surface area of the wafer that does not contain any metal depositions or metal pattern.

The invention provides such a surface area by defining a dummy pattern that is used for overlay measurement purposes in either:

1. in the Alignment Mark (AM) location that is typically provided in the perimeter of the wafer surface, or
2. in the scribe line that is typically provided in the surface of a wafer.

Because no metal is typically deposited in the Alignment Mark surface area or the scribe line of the wafer surface, the conventionally experienced overlay wafer scale measurement error, caused by asymmetry in the metal deposition as highlighted above, will not occur. The correct overlay wafer scale can then be measured by for instance using a box-in-box pattern that has, in accordance with the invention, been created in the Alignment Mark surface area or the scribe line on the wafer surface. By following this method, the overlay scale data can be measured before metal etching, allowing for rework of wafers that do not meet the specification. If this parameter is measured after metal etch, this may lead to wafer scrapping for wafer that do not meet the overlay scale data specifications.

Figure 7:
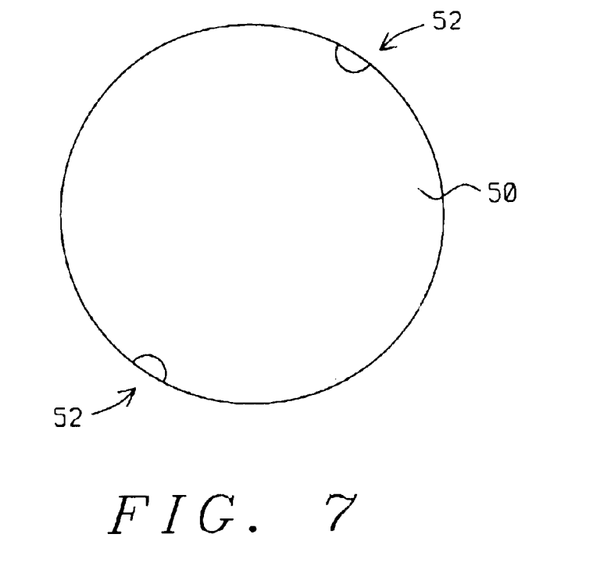
FIG. 7 shows a top view of a substrate, highlighting mark shielding surface regions.

FIG. 7 shows a top view of semiconductor substrate 50, highlighted in the perimeter of substrate 50 are the mark shielding regions 52. It is in there regions that accurate overlay value for wafer scale can be measured before metal etching by providing, in this region, for instance a box-in-box alignment pattern. The alignment pattern that is provided in the mark shielding regions 52 can be defined in one of two ways:

1. the conventional clear out window pattern can be replaced with an alignment pattern such as a box-in-box alignment pattern or vernia; this alignment pattern can be exposed at the time of job definition since, in applying mark shielding technology for the creation of the alignment pattern, the mark shielding region is of no value as a Clear-Out-Window (CLWD), and
2. a new, dummy alignment pattern can be defined (using for instance of box-in-box pattern) at job definition time at the scribe line of the substrate, and expose this new dummy alignment pattern (used for the patterning and etching of the dielectric and metal layer) at the mark shielding region for the metal and oxide layer; by measuring the metal/oxide overlay at the mark shielding region, the correct wafer scale value can be obtained, eliminating the conventional measurement error that has been highlighted above as being caused by metal deposition effects of asymmetry.

Figure 8A:
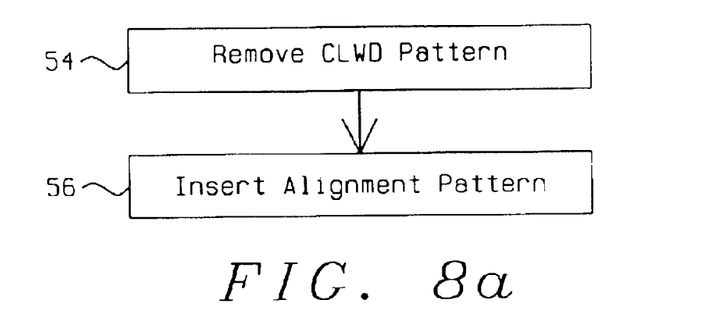
FIGS. 8a and 8b highlight implementations of the alignment mark of the invention.
Figure 8B:
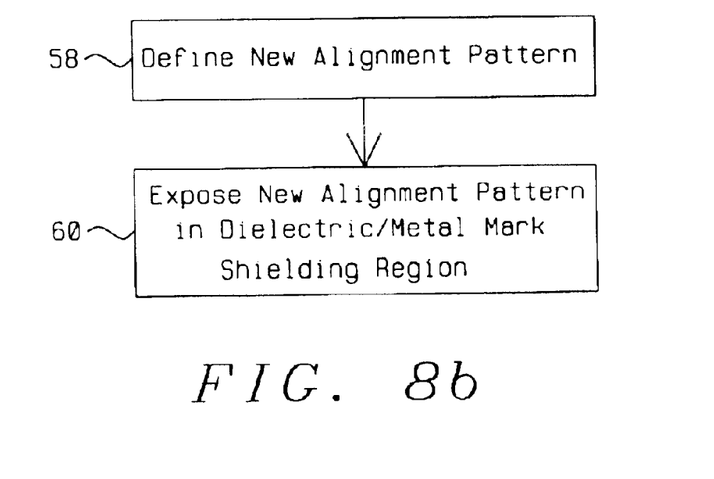

In sum, referring to the flow diagrams of FIGS. 8a and 8b, the invention provides for:

1. replacing the Clear-Out-Window pattern (CLWD) with an alignment pattern, FIG. 8a, step 54, and exposing the alignment pattern in mark shielding surface area of the wafer, where conventionally he CLWD pat-tern would be applied FIG. 8a, step 56, and
2. define a new, dummy pattern FIG. 8b, step 58, and expose this dummy pattern at the oxide/metal mark shielding region of he substrate, FIG. 8b, step 60.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for reduction of wafer scale error caused by metal deposition, comprising steps of:
   providing a substrate;
   providing an exposure mask;
   providing an alignment pattern in said exposure mask at a location where a Clear Out Window pattern would be formed in another mask of a type having a Clear Out Window pattern; and
   exposing said alignment pattern at job definition time.
2. The method of claim 1, said alignment pattern comprising a box-in-box pattern.

3. A method for reduction of wafer scale error caused by metal deposition, comprising steps of:
   providing a substrate;
   providing an exposure mask;
   defining a dummy pattern in said exposure mask, said dummy pattern to be exposed in an oxide/metal mark shielding region of said substrate; and
   exposing said dummy pattern at job definition time.
4. The method of claim 3, said dummy pattern comprising a box-in-box pattern.

5. A method for reduction of wafer scale error caused by metal deposition, using a surface area of the wafer that does not contain any metal depositions or metal pattern, comprising steps of:
   providing a substrate;
   providing an exposure mask;
   providing an alignment pattern in said exposure mask at a location where a Clear Out Window pattern would be formed in another mask of a type having a Clear Out Window pattern, said alignment pattern to be exposed on a surface area of the wafer for forming a transferred alignment pattern without forming any metal depositions or metal pattern directly thereon; and
   exposing said alignment pattern at job definition time.
6. The method of claim 5, said alignment pattern comprising a box-in-box pattern.

7. A method for reduction of wafer scale error caused by metal deposition, using a surface area of the wafer that does not contain any metal depositions or metal pattern, comprising steps of:
   providing a substrate;
   providing an exposure mask;
   defining a dummy pattern in said exposure mask, said dummy pattern being located in an oxide/metal mark shielding region of said substrate, said dummy pattern to be exposed in a surface area of the wafer for forming a transferred dummy pattern without forming any metal depositions or metal pattern directly thereon; and
   exposing said dummy pattern at job definition time.
8. The method of claim 7, said dummy pattern comprising a box-in-box pattern.

9. A method for reduction of wafer scale error caused by metal deposition, using a surface area of the wafer that does not contain any metal depositions or metal pattern, comprising steps of:
   providing a substrate;
   providing an exposure mask;
   providing an alignment pattern in an Alignment Mark pattern location in said exposure mask, said alignment pattern to be exposed on a surface area of the wafer for forming a transferred alignment pattern without forming any metal depositions or metal pattern directly thereon; and
   exposing said alignment pattern at job definition time.
10. The method of claim 9, said alignment pattern comprising a box-in-box pattern.

11. A method for reduction of wafer scale error caused by metal deposition, using an Alignment Mark (AM) location that is typically provided in a perimeter of the wafer surface, comprising steps of:
   providing a substrate;
   providing an exposure mask;
   defining a dummy pattern in said exposure mask, said dummy pattern being located in an Alignment Mark location, said dummy pattern to be exposed on a surface area of the wafer for forming a transferred dummy pattern without forming any metal depositions or metal pattern directly thereon; and exposing said dummy pattern at job definition time.

12. The method of claim 11, said dummy pattern comprising a box-in-box pattern.

13. A method for reduction of wafer scale error caused by metal deposition, using a surface area of the wafer that does not contain any metal depositions or metal pattern, comprising steps of:

providing a substrate;

providing an exposure mask;

placing an alignment pattern in the scribe line, said alignment pattern to be exposed on a surface area of the wafer for forming a transferred alignment pattern without forming any metal depositions or metal pattern directly thereon; and exposing said alignment pattern at job definition time.

14. The method of claim 13, said alignment pattern comprising a box-in-box pattern.

15. A method for reduction of wafer scale error caused by metal deposition, using an Alignment Mark (AM) location that is typically provided in a perimeter of the wafer surface, comprising steps of:

providing a substrate;

providing an exposure mask;

defining a dummy pattern in said exposure mask, said dummy pattern being located in a scribe line, said dummy pattern to be exposed on a surface area of the wafer for forming a transferred dummy pattern without forming any metal depositions or metal pattern directly thereon; and exposing said dummy pattern at job definition time.

16. The method of claim 15, said dummy pattern comprising a box-in-box pattern.

17. A method for measuring overlay scale data before metal etching, allowing for rework of wafers that do not meet the specification, comprising steps of:

providing a substrate;

providing an exposure mask;

providing an alignment pattern in said exposure mask at a location where a Clear Out Window pattern would be formed in another mask of a type having a Clear Out Window pattern; and exposing said alignment pattern at job definition time.

18. The method of claim 17, said alignment pattern comprising a box-in-box pattern.

19. A method for measuring overlay scale data before metal etching, allowing for rework of wafers that do not meet the specification, comprising steps of:

providing a substrate;

providing an exposure mask;

defining a dummy pattern in said exposure mask, said dummy pattern to be exposed in an oxide/metal mark shielding region of said substrate; and exposing said dummy pattern at job definition time.

20. The method of claim 19, said dummy pattern comprising a box-in-box pattern.

21. A method for measuring overlay scale data before metal etching, allowing for rework of wafers that do not meet the specification, using a surface area of the wafer that does not contain any metal depositions or metal pattern, comprising steps of:

providing a substrate;

providing an exposure mask;

providing an alignment pattern in said exposure mask at a location where a Clear Out Window pattern would be formed in another mask of a type having a Clear Out Window pattern, said alignment to be exposed on a surface area of the wafer for forming a transferred alignment pattern without forming any metal depositions or metal pattern directly thereon; and exposing said alignment pattern at job definition time.

22. The method of claim 21, said alignment pattern comprising a box-in-box pattern.

23. A method for measuring overlay scale data before metal etching, allowing for rework of wafers that do not meet the specification, using a surface area of the wafer that does not contain any metal depositions or metal pattern, comprising steps of:

providing a substrate;

providing an exposure mask;

defining a dummy pattern in said exposure mask, said dummy pattern being to be exposed on an oxide/metal mark shielding region of said substrate, said oxide/metal mark shielding region being located in a surface area of the wafer for forming a transferred dummy pattern without forming any metal depositions or metal pattern directly thereon; and exposing said dummy pattern at job definition time.

24. The method of claim 23, said dummy pattern comprising a box-in-box pattern.

25. A method for measuring overlay scale data before metal etching, allowing for rework of wafers that do not meet the specification, using a surface area of the wafer that does not contain any metal depositions or metal pattern, comprising steps of:

providing a substrate;

providing an exposure mask;

providing an alignment pattern in an Alignment Mark pattern location in said exposure mask, said alignment pattern to be exposed on a surface area of the wafer for forming a transferred alignment pattern without forming any metal depositions or metal pattern directly thereon; and exposing said alignment pattern at job definition time.

26. The method of claim 25, said alignment pattern comprising a box-in-box pattern.

27. A method for measuring overlay scale data before metal etching, allowing for rework of wafers that do not meet the specification, using an Alignment Mark (AM) location that is typically provided in a perimeter of the wafer surface, comprising steps of:

providing a substrate;

providing an exposure mask;

defining a dummy pattern in said exposure mask, said dummy pattern being located in an Alignment Mark location, said dummy pattern to be exposed on a surface area of the wafer for forming a transferred dummy pattern without forming any metal depositions or metal pattern directly thereon; and exposing said dummy pattern at job definition time.

28. The method of claim 27, said dummy pattern comprising a box-in-box pattern.

29. A method for measuring overlay scale data before metal etching, allowing for rework of wafers that do not meet specification, using a surface area of the wafer that does not contain any metal depositions or metal pattern, comprising steps of:

provide a substrate;

providing an exposure mask;

placing an alignment pattern in the scribe line, said alignment pattern to be exposed on a surface area of the wafer for forming a transferred alignment pattern without forming any metal depositions or metal pattern directly thereon; and exposing said alignment pattern at job definition time.

30. The method of claim 29, said alignment pattern comprising a box-in-box pattern.

31. A method for measuring overlay scale data before metal etching, allowing for rework of wafers that do not meet the specification, using an Alignment Mark (AM) location that is typically provided in a perimeter of the wafer surface, comprising steps of:

providing a substrate;

providing an exposure mask; defining a dummy pattern in said exposure mask, said dummy pattern exposed in an scribe line, said dummy pattern to be exposed on a surface area of the wafer for forming a transferred dummy pattern without forming any metal depositions or metal pattern directly thereon; and exposing said dummy pattern at job definition time.

32. The method of claim 31, said dummy pattern comprising a box-in-box pattern.

* * * * *

UNITED STATES PATENT AND TRADEMARK OFFICE
CERTIFICATE OF CORRECTION

PATENT NO.    : 6,838,217 B1
DATED         : January 4, 2005
INVENTOR(S)   : Yi-Lin Chen et al.

It is certified that error appears in the above-identified patent and that said Letters Patent is hereby corrected as shown below:

Column 8,
Line 6, insert -- pattern -- between "alignment" and "to be exposed".

Signed and Sealed this

Sixteenth Day of August, 2005

JON W. DUDAS
*Director of the United States Patent and Trademark Office*